United States Patent [19]
Takeda et al.

[11] Patent Number: 5,200,876
[45] Date of Patent: Apr. 6, 1993

[54] ELECTROSTATIC BREAKDOWN PROTECTION CIRCUIT

[75] Inventors: Etsuya Takeda, Suita; Yutaka Nanno, Amagasaki, both of Japan

[73] Assignee: Matsushita Electric Industrial Co., Ltd., Osaka, Japan

[21] Appl. No.: 507,118

[22] Filed: Apr. 10, 1990

[30] Foreign Application Priority Data

Apr. 10, 1989 [JP] Japan .................. 1-901115

[51] Int. Cl.$^5$ .............................. H02H 9/00
[52] U.S. Cl. ............................. 361/91; 361/56; 361/111
[58] Field of Search ............. 361/56, 58, 91, 111

[56] References Cited

U.S. PATENT DOCUMENTS

| | | | |
|---|---|---|---|
| 4,736,271 | 4/1988 | Mack et al. | 361/91 |
| 4,855,863 | 8/1989 | Yoshitake | 361/91 |
| 4,868,705 | 9/1989 | Shiochi et al. | 361/91 |

OTHER PUBLICATIONS

"Novel a-Si:H Thin Film High Voltage Transistor", Hsing C. Tuan; pp. 651–656.
"Physics of Novel Amorphous Silicon High-Voltage Transistor", Hack et al.; pp. 457–462.
"Gate Protection for CMOS/SOS", R. K. Pancholy; 15th Annual Proceedings-Reliability Physics 1977; pp. 132–137.

*Primary Examiner*—Steven L. Stephan
*Assistant Examiner*—Adolf Berhane
*Attorney, Agent, or Firm*—Wenderoth, Lind & Ponack

[57] ABSTRACT

An electrostatic breakdown protection circuit protects an internal circuit from positive and negative high voltages. One form of the protection circuit includes a hot line connected to the internal circuit for supplying a data signal, a bypass line, a first diode connected in a first direction between the hot line and the bypass line, and a second diode connected in a second direction between the hot line and the bypass line in parallel to the first diode.

10 Claims, 4 Drawing Sheets

ELECTROSTATIC BREAKDOWN PROTECTION CIRCUIT

BACKGROUND OF THE INVENTION

1. Field of the Invention

The present invention relates to an electrostatic breakdown protection circuit.

2. Description of the Prior Art

Shown in FIG. 5 is an example of a prior art electrostatic breakdown protection circuit, which includes a hot line 30 for carrying a data signal, an internal circuit 32 connected to the hot line 30 for receiving the data signal, a protection diode Da connected to ground and a protection diode Db connected to a power source line.

In operation, when a negative high surge voltage appears on the hot line 30, such a high voltage will be transmitted through diode Da to ground. Similarly, when a positive high surge voltage appears on the hot line 30, the high voltage will be transmitted through diode Db to the power source line. Therefore, the internal circuit 32 can be protected from a negative or positive surge voltage.

A protection circuit can be formed by connecting the gate bus lines or source bus lines, using a shortcircuit ring, an example of which is disclosed in Japanese Patent laid open publication No. 61-88557, published May 6, 1986. The shortcircuit ring is removed after the internal circuit is completed.

According to the prior art, one group of the protection diodes Da is connected to ground and another group of the protection diodes Db is connected to the power source line. Thus, the internal circuit can be easily shortcircuited to the ground or power source line, and thus it can be easily broken during the manufacturing thereof.

Also, when the shortcircuit ring is removed, the internal circuit 32 is not protected from positive or negative high voltages.

SUMMARY OF THE INVENTION

The present invention has been developed with a view to substantially solving the above described disadvantages and has for its essential object to provide an improved electrostatic breakdown protection circuit which can be assembled without any connection to a power source line.

It is also an object of the present invention to provide an improved electrostatic breakdown protection circuit which can be easily formed during the forming step of the internal circuit.

In order to achieve the aforementioned objectives an electrostatic breakdown protection circuit according to the present invention comprises a hot line connected to the internal circuit for supplying a data signal; a bypass line; a first diode connected in a first direction between the hot line and the bypass line; and a second diode connected in a second direction between the hot line and the bypass line in parallel to, or in series with, the first diode.

BRIEF DESCRIPTION OF THE DRAWINGS

These and other objects and features of the present invention will become clear from the following description taken in conjunction with the preferred embodiments thereof with reference to the accompanying drawings throughout in which like parts are designated by like reference numerals, and in which.

DETAILED DESCRIPTION OF THE PREFERRED EMBODIMENTS

Figure 1A:
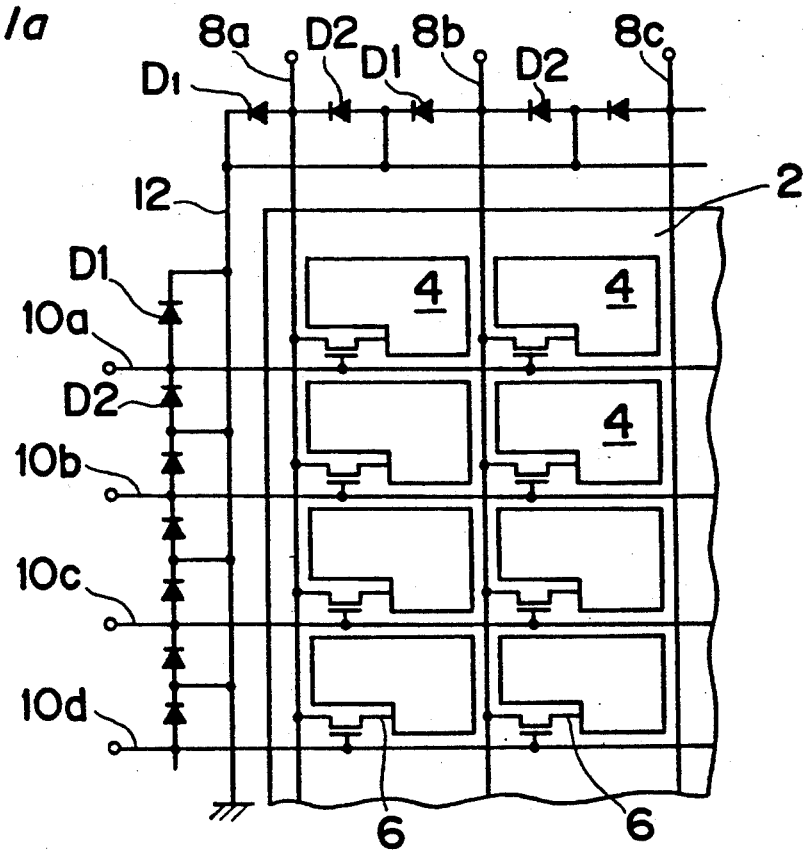
FIG. 1a is a circuit diagram of a liquid crystal display device employing an electrostatic breakdown protection circuit according to the first embodiment of the present invention.

Referring to FIG. 1a, a portion of a liquid crystal display device employing an electrostatic breakdown protection circuit according to the first embodiment of the present invention is shown. The display device comprises a transparent plate, such as a glass plate 2, on which internal circuits 4 are aligned in two orthogonal directions. Each internal circuit 4, which is provided for forming a pixel, is coupled with a thin film transistor (TFT) 6 having a source, a drain and a gate. The drains of TFTs 6 are connected to the corresponding internal circuits 4, respectively. The sources of the vertically aligned TFTs 6 are connected to vertically extending common source lines 8a, 8b and 8c. Similarly, the gates of the vertically aligned TFTs 6 are connected to horizontally extending common gate lines 10a, 10b, 10c and 10d.

According to the first embodiment shown in FIG. 1a, with respect to the vertically extending common source line 8a, a protection diode D1 is connected in a forward direction to a bypass line 12 and another protection diode D2 is connected in a reverse direction to the same bypass line 12. In a similar manner, common source line 8b is connected to bypass line 12 by way of a forward biased diode D1 and also by way of a reverse biased diode D2. Similarly, other common source lines are connected to the bypass line 12 through protection diodes D1 and D2. Preferably the bypass line 12 is connected to ground.

Also, according to the first embodiment, with respect to common gate line 10a, a diode D1 is connected in a forward direction to the bypass line 12 and a diode D2 is connected in a reverse direction to the bypass line 12. Similarly, other common gate lines are connected to the bypass line 12 through diodes D1 and D2.

In operation, only the voltage signal within a predetermined range is transmitted through each of hot lines 8a, 8b ..., and 10a, 10b, ... and any excessively high or excessively low voltage signals, such as a surge voltage appearing on the hot lines will escape through diode to the ground line. The detail of this operation is explained below.

Figure 2A:
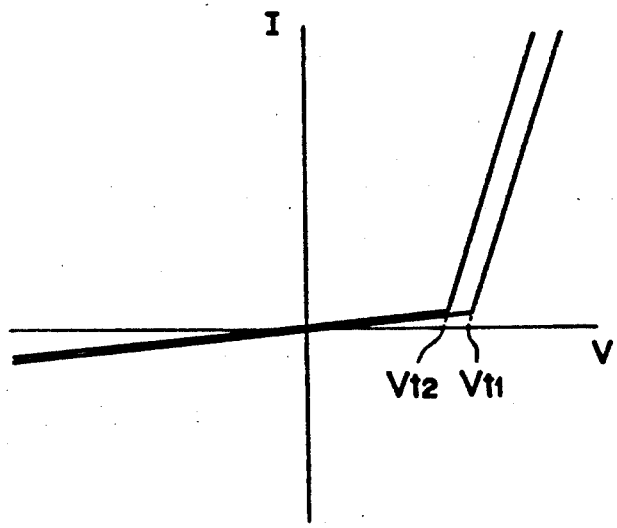
FIG. 2a is graph showing a current-voltage relationship of a protection diode.
Figure 2B:
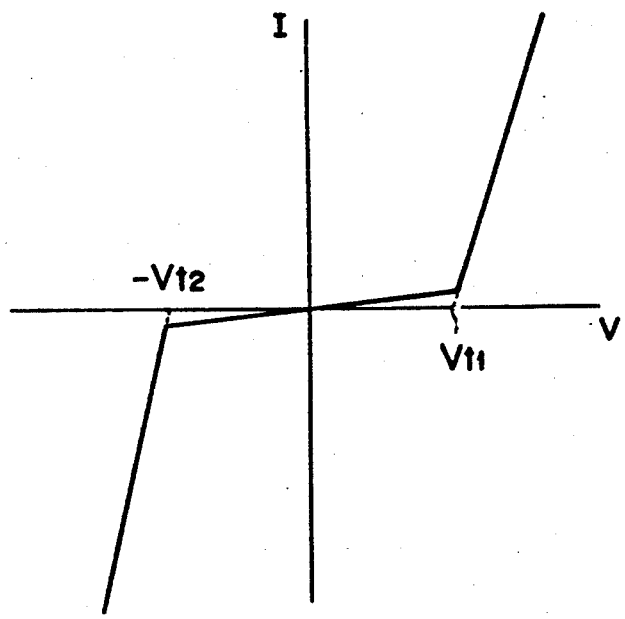
FIG. 2b is a graph showing a current-voltage relationship of a protection circuit of the present invention.

As shown in FIG. 2a, diode D1 has a threshold voltage $V_{t1}$ and diode D2 has a threshold voltage $V_{t2}$ so that, when a signal carried on common source line 8a is taken in to consideration, forward connected diode D1 serves as a switching diode to permit a voltage signal below threshold $+V_{t1}$ to stay on the common spurce line 8a, and any voltage signal above the threshold $+V_{t1}$ to break through diode D1 to bypass line 12. Likewise, reverse connected diode D2 serves as a switching diode to permit a voltage signal above threshold $-V_{t2}$ to stay on the common source line 8a, and any voltage signal below the threshold $-V_{t2}$ to break through diode D2 to bypass line 12. Thus, as long as the signal on line 8a is between $-V_{t2}$ and $+V_{t1}$, as shown in FIG. 2b, the signal will be properly transmitted through line 8a. However, if a high or low voltage, such as a surge voltage, which is greater than $+V_{t1}$ or smaller than $-V_{t2}$ appears on line 8a, the surge voltage will break through the diode D1 or D2 to bypass line 12, thereby protecting the TFTs connected to line 8a from the surge voltage. According to a preferred embodiment, the threshold voltages $-V_{t2}$ and $+V_{t1}$ should be +20V and -20V.

Figure 3:
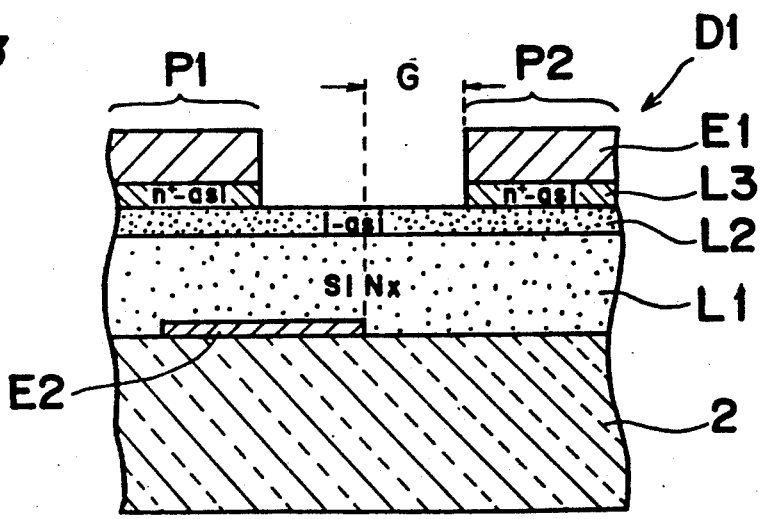
FIG. 3 is a cross sectional view of a protection diode employed in the present invention.

Referring to FIG. 3, a cross sectional view of one diode D1 formed on the glass plate 2 is shown. The diode D1 comprises an insulation (SiN$_x$) layer L1, semiconductor (i-aSi) layer L2 and n$^+$-aSi layer L3. For example, the insulation layer L1 may be formed by Si$_3$N$_4$; semiconductor layer L2 may be formed by amorphous silicon and n$^+$-aSi layer L3 be formed by n$^+$ doped amorphous silicon. Provided on the n$^+$-aSi layer L3 is an electrode layer E1. Also, an electrode E2 is previously formed on the glass plate 2. For forming a diode D1 or D2, the n$^+$-aSi layer L3 and electrode layer E1 are etched in a predetermined pattern so that a number of remaining portions P1 and P2 are formed.

This is the same process for making the TFT 6 on the glass plate 2, in which case the remaining portion P1 is used as a source and the remaining portion P2 is used as a drain and the electrode E2 is used as a gate.

For forming diode D1 or D2, the portion P1 partly overlaps with electrode E2, and another remaining portion P2 is offset from electrode E2 by a distance G, as shown in FIG. 3. Furthermore, portion P1 and electrode E2 are connected together to form an anode side of the diode and portion P2 forms a cathode side of the diode. In other words, for forming diode D1 or D2 from a TFT, either the source or drain electrode is connected to the gate electrode to form one side of the diode and the remaining one of the source and drain electrodes forms the other side of the diode.

The threshold voltage $V_{t1}$ or $V_{t2}$ of the diode is controlled either (i) by the substance constituting the SiN$_x$ layer L1, (ii) by the thickness of the SiN$_x$ layer L1, or (iii) by the distance G.

The first two methods (i) and (ii) are suitable when the layers L1, L2 and L3 are formed, not in the TFT formed as shown in FIG. 3, but in the usual diode form with three layers one over the other. For example, with the use of Si$_3$N$_4$ for the material of the layer L1, and the thickness thereof being 90 nm, the threshold of 30V is obtained. These two methods are difficult from the viewpoint of mass production, because the control of the thickness 90 nm is very difficult.

The third method (iii) is particularly suitable when the diode is formed together with other electronic devices such as the TFTs in the present embodiment. For example, when the distance G is arranged to be equal to 20 μm, the threshold of 50V is obtained. The third method is advantageous in that the threshold can be easily controlled by the control of a mask pattern for forming the diode, and that the diodes can be easily formed during the forming of the TFTs. A diode having a distance G of 30 μm has been tested, and the obtained result is as follows. When the voltage applied between the anode and the cathode of the diode is 20V, the current between the anode and cathode showed only $1\times10^{-6}$A to keep the diode substantially in the switched off condition, but when the applied voltage is increased to 100V, a leak current flowed through the diode to substantially change the diode in the switched on condition.

Figure 1B:
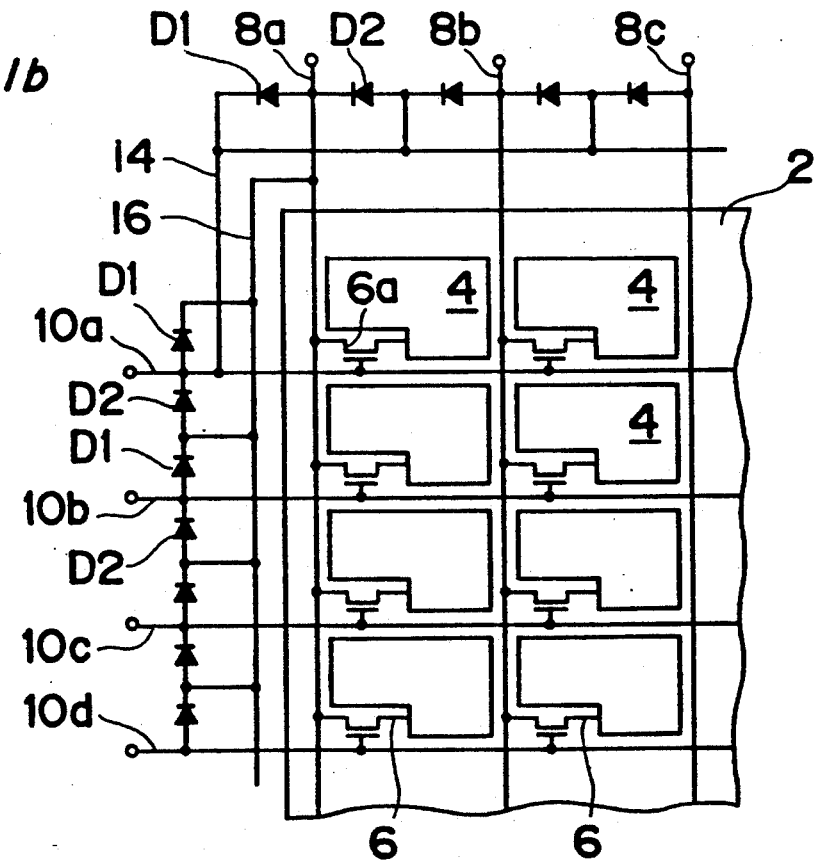
FIG. 1b is a circuit diagram which is similar to FIG. 1a, but particularly showing a modification thereof.

Referring to FIG. 1b, a modification of the first embodiment is shown. When compared with the arrangement of FIG. 1a, the arrangement of FIG. 1b is not made up of a single grounded bypass line 12, but instead two bypass lines 14 and are provided.

Bypass line 14 is connected to each of the vertically extending common source lines 8a, 8b and 8c, through respective protection diodes D1 and D2, and also to a horizontally extending common base line 10a located at one end of the alignment of common base lines.

Also, bypass line 16 is connected to each of the horizontally extending common base lines 10a, 10b, 10c and 10d, through respective protection diodes D1 and D2, and also to a vertically extending common source line 8a located at one end of the alignment of common source lines.

In operation, when a surge voltage appears on line 8a, such a surge voltage leaks through diode D1 or D2 to appear on line 14 and, in turn, on line 10a. Thus, when a TFT 6a (FIG. 1b) provided in the upper left corner pixel receives a high surge voltage from line 8a and also from line 10a, the voltage difference between the base and source of TFT 6a will be very small, resulting in no damage of the TFT 6a. Since the TFTs aligned at the perimeter of the matrix array are liable to surge voltages the circuit of FIG. 1b is particularly suited for protecting the TFTs at the perimeter of the matrix array.

Figure 4A:
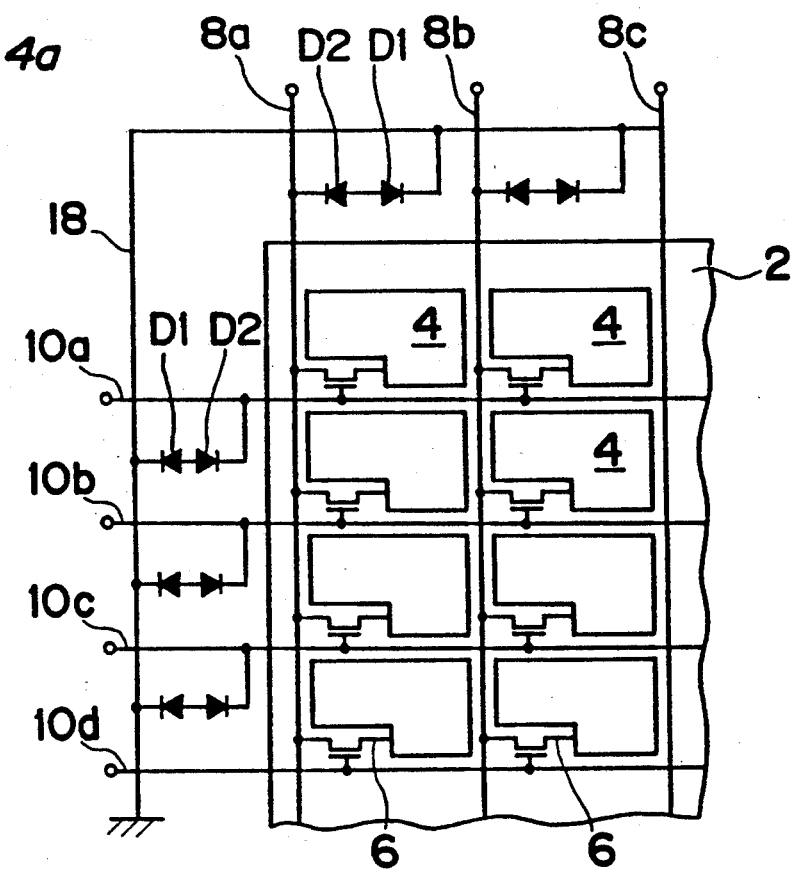
FIGS. 4a and 4b are views similar to FIGS. 1a and 1b, but particularly showing a second embodiment thereof.

Referring to FIG. 4a, an electrostatic breakdown protection circuit according to the second embodiment of the present invention is shown. When compared with the arrangement of the first embodiment shown in FIG. 1a, the arrangement shown in FIG. 2 differs in the connection of diodes D1 and D2. Instead of connecting the diodes D1 and D2 in separate lines from a hot line, such as from line 8a, the diodes D1 and D2 are connected in series in opposite direction, and are inserted in a single line extending from the line 8a, which is in turn connected to ground line 18. According to the second embodiment, each of the diodes can be formed by a M-I-M diode which is formed by a metal layer, insulation layer and metal layer.

Figure 4B:
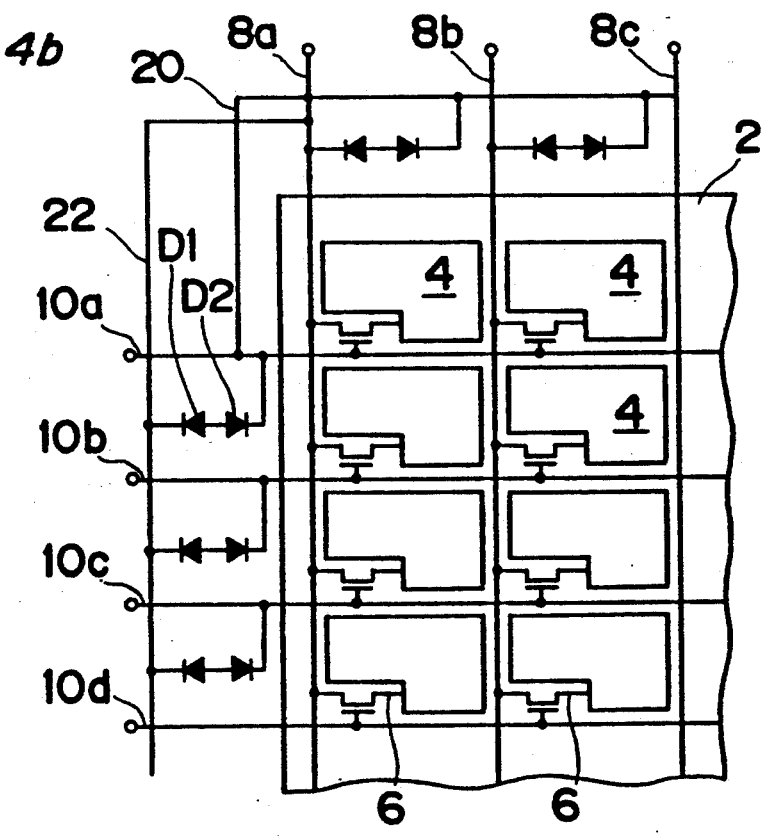
Figure 5:
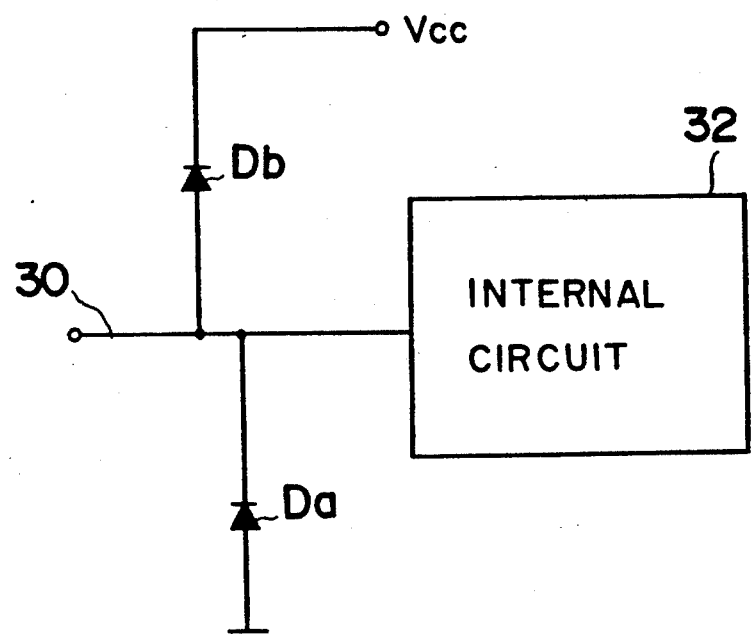
FIG. 5 is a circuit diagram of a electrostatic breakdown protection circuit of the prior art.

Referring to FIG. 4b, a modification of the second embodiment is shown. When compared with the arrangement of FIG. 4a, the arrangement of FIG. 4b is not made up of a single ground line 18, but instead two bypass lines 20 and 22 are provided.

Bypass line 20 is connected to each of the vertically extending common source lines 8a, 8b and 8c, through protection diodes D1 and D2 in series, and in turn to a horizontally extending common base line 10a located at one end of the alignment of common base lines.

Also, bypass line 22 is connected to each of the horizontally extending common base lines 10a, 10b, 10c and 10d, through protection diodes D1 and D2, and also to a vertically extending common source line 8a located at one end of the alignment of common source lines.

According to the electrostatic breakdown protection circuit of the present invention, the TFT circuits can be protected without having one end of the protection diode, which is remote from the hot line, connected to a power source line or ground line. Therefore, it is not necessary to remove the protection circuit of the present invention after the internal circuit has been completed. Therefore, the internal circuit can be protected not only during the manufacture process of the internal circuit, but even during the operation of the internal circuit.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electrostatic breakdown protection circuit for preventing an internal circuit from positive and negative high voltages, comprising:
   a hot line connected to said internal circuit for supplying a data signal;
   a bypass line;
   a first diode connected in a first direction between said hot line and said bypass line; and
   a second diode connected in a second direction between said hot line and said bypass line and connected in parallel to said first diode;
   wherein each of said first and second diodes is formed by a first electrode and a second electrode which are separated from each other by an insulation layer provided between said first and second electrodes, said first and second electrodes being offset in a lateral direction by a predetermined distance.

2. An electrostatic breakdown protection circuit as claimed in claim 1, wherein said bypass line is connected to ground.

3. An electrostatic breakdown protection circuit for protecting a thin film transistor array, arranged horizontally and vertically, from positive and negative high voltages, comprising:
   a plurality of vertically extending hot lines, each connected to one terminal of vertically aligned thin film transistors;
   a plurality of horizontally extending hot lines, each connected to another terminal of horizontally aligned thin film transistors;
   a bypass line;
   a plurality of first diodes respectively connected in a first direction between said vertically and horizontally extending hot lines and said bypass line; and
   a plurality of second diodes respectively connected in a second direction between said vertically and horizontally extending hot lines and said bypass line in parallel to a respective one of said first diodes;
   wherein each of said first and second diodes is formed by a first electrode and a second electrode which are separated from each other by an insulation layer provided between said first and second electrodes, said first and second electrodes being offset in a lateral direction by a predetermined distance.

4. An electrostatic breakdown protection circuit as claimed in claim 3, wherein said bypass line is connected to ground.

5. An electrostatic breakdown protection circuit as claimed in claim 3, wherein said bypass line comprises a first bypass line and a second bypass line, said first bypass line being connected to a one of said horizontally extending hot lines which is located at one end of the array and to each of said vertically extending hot lines, and said second bypass line being connected to a one of said vertically extending hot liens which is located at one end of the array and to each of said first and second diodes which are connected to each of said horizontally extending hot lines.

6. An electrostatic breakdown protection circuit for protection an internal circuit from positive and negative high voltages, comprising:
   a hot line connected to said internal circuit for supplying a data signal;
   a bypass line;
   a first diode connected in a first direction between said hot line and said bypass line; and
   a second diode connected in a second direction between said hot line and said bypass line in series with said first diodes;
   wherein each of said first and second diodes is formed by a first electrode and a second electrode which are separated from each other by an insulation layer provided between said first and second electrodes, said first and second electrodes being offset in a lateral direction by a predetermined distance.

7. An electrostatic breakdown protection circuit as claimed in claim 6, wherein said bypass line is connected to ground.

8. An electrostatic breakdown protection circuit for protecting a thin film transistor array, arranged horizontally and vertically, from positive and negative high voltages, comprising:
   a plurality of vertically extending hot lines, each connected to one terminal of vertically aligned thin film transistors;
   a plurality of horizontally extending hot lines, each connected to another terminal of horizontally aligned thin film transistors;
   a bypass line;
   a plurality of first diodes respectively connected in a first direction between said vertically and horizontally extending hot lines and said bypass line; and
   a plurality of second diodes respectively connected in a second direction between said vertically and horizontally extending hot lines and said bypass line in series with a respective one of said first diodes;
   wherein each of said first and second diodes is formed by a first electrode and a second electrode which are separated from each other by an insulation layer provided between said first and second electrodes, said first and second electrodes being offset in a lateral direction by a predetermined distance.

9. An electrostatic breakdown protection circuit as claimed in claim 8, wherein said bypass line is connected to ground.

10. An electrostatic breakdown protection circuit as claimed in claim 8, wherein said bypass line comprises a first bypass line and a second bypass line, said first bypass line being connected to a one of said horizontally extending hot lines which is located at one end of the array and to each series connection of said first and second diodes which are connected to each of said vertically extending hot liens, and said second bypass line being connected to a one of said vertically extending hot lines which is located at one end of the array and to each series connection of said first and second diodes which are connected to each of said horizontally extending hot lines.

* * * * *